(12) United States Patent
Kijima et al.

(10) Patent No.: US 7,428,162 B2
(45) Date of Patent: Sep. 23, 2008

(54) MEMORY DEVICE INCLUDING A PLURALITY OF CAPACITORS

(75) Inventors: Takeshi Kijima, Matsumoto (JP);
Yasuaki Hamada, Suwa (JP); Tatsuya Shimoda, Nomi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/639,174

(22) Filed: Dec. 14, 2006

(65) Prior Publication Data
US 2007/0138522 A1 Jun. 21, 2007

(30) Foreign Application Priority Data
Dec. 20, 2005 (JP) .............................. 2005-366925

(51) Int. Cl.
*G11C 11/22* (2006.01)
(52) U.S. Cl. .................... 365/145; 365/117; 365/65
(58) Field of Classification Search ................. 365/145, 365/117, 65, 102
See application file for complete search history.

(56) References Cited
U.S. PATENT DOCUMENTS
4,972,370 A * 11/1990 Morimoto et al. ........... 365/106
5,751,037 A * 5/1998 Aozasa et al. ............... 257/315

* cited by examiner

*Primary Examiner*—Thong Q Le
(74) *Attorney, Agent, or Firm*—Harness, Dickey & Pierce, P.L.C.

(57) ABSTRACT

A memory device including: a lower electrode; a ferroelectric layer formed above the lower electrode; a charge compensation layer formed above the ferroelectric layer and including an oxide having a composition differing from a composition of the ferroelectric layer; and upper electrodes formed above the charge compensation layer. The upper electrodes includes: a saturated polarization forming electrode used for forming a domain polarized to saturation in a predetermined direction in a predetermined region of the ferroelectric layer; a writing electrode disposed apart from the saturated polarization forming electrode; and a reading electrode disposed apart from the writing electrode.

4 Claims, 12 Drawing Sheets

US 7,428,162 B2

MEMORY DEVICE INCLUDING A PLURALITY OF CAPACITORS

Japanese Patent Application No. 2005-366925, filed on Dec. 20, 2005, is hereby incorporated by reference in its entirety.

BACKGROUND OF THE INVENTION

The present invention relates to a memory device having a novel structure and operation principle.

As ferroelectric memories utilizing a ferroelectric, a one-transistor (1T) ferroelectric random access memory (FeRAM), a one-transistor one-capacitor (1T1C) FeRAM, and a two-transistor two-capacitor (2T2C) FeRAM have been known.

As the structure of the 1T FeRAM, a metal-ferroelectric-semiconductor (MFS) structure, a metal-ferroelectric-insulator-semiconductor (MFIS) structure, and a metal-ferroelectric-metal-insulator-semiconductor (MFMIS) structure have been known. In FeRAMs having these structures, the amount of drain current at a specific gate voltage is utilized as memory information since the polarization state of the ferroelectric forming a gate insulating film changes the transistor threshold voltage. However, these 1T FeRAMs have many problems. In the MFS structure, since the surface of a group-IV semiconductor substrate formed of silicon or germanium is easily oxidized, it is very difficult to form an oxide ferroelectric layer on the surface of the substrate. This makes it difficult to utilize the MFS structure in practical application. FeRAMs having the MFIS structure or the MFMIS structure also suffer from the same problem.

In the 1T1C and 2T2C FeRAMs, the remanent polarization point in the polarization reversal hysteresis characteristics of the ferroelectric is utilized as memory information. However, these FeRAMs have problems such as the fatigue of the ferroelectric film and the electrode and deterioration in data retention characteristics due to deformation in the hysteresis loop.

SUMMARY

According to one aspect of the invention, there is provided a memory device comprising:
  a lower electrode;
  a ferroelectric layer formed above the lower electrode;
  a charge compensation layer formed above the ferroelectric layer and including an oxide having a composition differing from a composition of the ferroelectric layer; and
  upper electrodes formed above the charge compensation layer, the upper electrodes including:
  a saturated polarization forming electrode used for forming a domain polarized to saturation in a predetermined direction in a predetermined region of the ferroelectric layer;
  a writing electrode disposed apart from the saturated polarization forming electrode; and
  a reading electrode disposed apart from the writing electrode.

DETAILED DESCRIPTION OF THE EMBODIMENT

The invention may provide a novel memory device utilizing a principle completely differing from that of the above-mentioned FeRAMs.

According to one embodiment of the invention, there is provided a memory device comprising:
  a lower electrode;
  a ferroelectric layer formed above the lower electrode;
  a charge compensation layer formed above the ferroelectric layer and including an oxide having a composition differing from a composition of the ferroelectric layer; and
  upper electrodes formed above the charge compensation layer, the upper electrodes including:
  a saturated polarization forming electrode used for forming a domain polarized to saturation in a predetermined direction in a predetermined region of the ferroelectric layer;
  a writing electrode disposed apart from the saturated polarization forming electrode; and
  a reading electrode disposed apart from the writing electrode.

The memory device according to this embodiment has the following features. Specifically, a saturated remanent polarization is caused to occur in the capacitor including the saturated polarization forming electrode by applying a predetermined electric field to the saturated polarization forming electrode. In the memory device according to this embodiment, since the charge compensation layer allows the saturated polarization to propagate in the ferroelectric layer, information can be read by detecting an induced current in another region such as utilizing the reading electrode. Information can be written by changing the saturated polarization state by applying an electric field to the writing electrode.

The memory device of this embodiment may further comprise:

a terminating electrode disposed above the charge compensation layer to enclose the saturated polarization forming electrode, the writing electrode, and the reading electrode at an interval from the saturated polarization forming electrode, the writing electrode, and the reading electrode.

In the memory device of this embodiment, the writing electrode and the reading electrode may be formed of a single electrode.

In the memory device of this embodiment, the saturated polarization forming electrode, the writing electrode, and the reading electrode may be arranged in a stripe shape.

1. MEMORY DEVICE

The principle of a known ferroelectric memory is described below so that the principle according to the invention is readily understood.

Figure 3A:
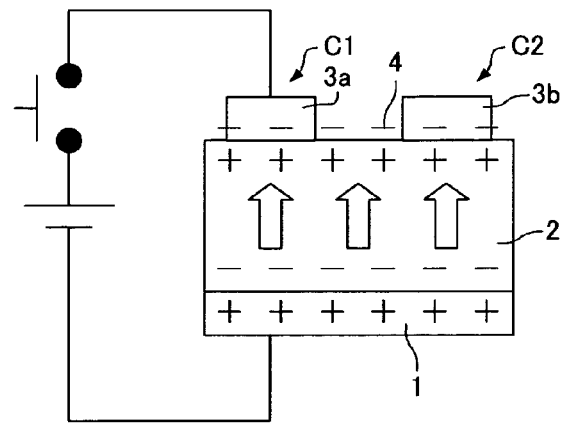
FIGS. 3A to 3C are conceptual diagrams showing an operation principle of a known ferroelectric memory.
Figure 3B:
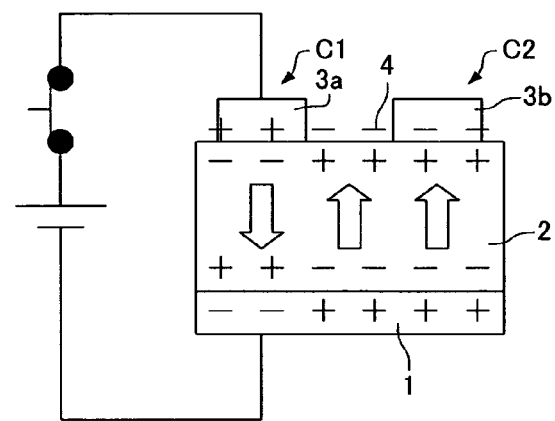
Figure 3C:
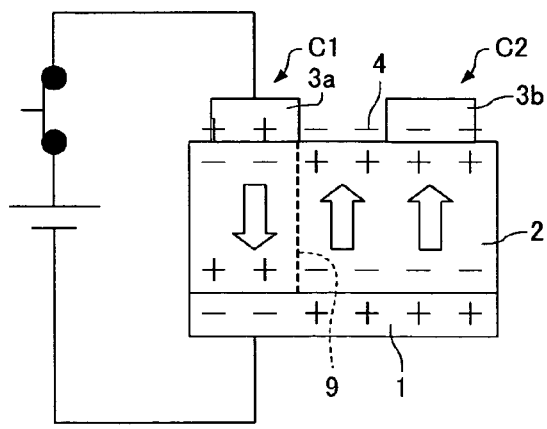

FIGS. 3A to 3C are conceptual diagrams showing the operation principle of a known ferroelectric memory utilizing the polarization reversal hysteresis characteristics of a ferroelectric.

FIGS. 3A to 3C, the ferroelectric memory includes a lower electrode 1, a ferroelectric layer 2 formed on the lower electrode 1, and a plurality of (two in the example shown in FIGS. 3A to 3C) upper electrodes 3a and 3b formed on the ferroelectric layer 2. In the example shown in FIGS. 3A to 3C, the lower electrode 1 forming capacitors is a common electrode. The lower electrode 1, the ferroelectric layer 2, and the upper electrode 3a make up a first capacitor C1.

The lower electrode 1, the ferroelectric layer 2, and the upper electrode 3b make up a second capacitor C2. The capacitors C1 and C2 respectively form memory cells.

As shown in FIG. 3A, when an upward spontaneous polarization occurs in the ferroelectric layer 2, negative charges are present at the lower part of the ferroelectric layer 2, and positive charges are present at the upper part of the ferroelectric layer 2. Positive surface charges are induced on the lower surface (lower electrode 1) of the ferroelectric layer 2, and negative surface charges are induced on the upper surface of the ferroelectric layer 2.

When applying a polarization reversal voltage to the first capacitor C1 on the left of the ferroelectric capacitors C1 and C2 polarized in a state shown in FIG. 3A, the polarization of the ferroelectric layer 2 is reversed in the first capacitor C1 on the left, as shown in FIG. 3B. In the region other than the capacitor C1, polarization reversal of the ferroelectric layer 2 is suppressed due to the effects of surface space charges 4 present on the surface of the ferroelectric layer 2. Therefore, the polarization reversal does not propagate beyond the capacitor C1, as shown in FIG. 3C. The polarization boundary at which the propagation of the polarization reversal stops is called a domain wall 9.

In known 1T1C and 2T2C FeRAMs utilizing the remanent polarization point in the polarization reversal hysteresis characteristics of the ferroelectric as memory information, the presence of the domain wall 9 is necessary since the information must be retained in capacitor units.

The operation principle of the memory device according to the invention is described below.

FIGS. 1A to 1C and FIGS. 2A to 2C are conceptual diagrams showing the operation principle of the memory device according to the invention. The memory device according to the invention differs from the ferroelectric memory shown in FIGS. 3A to 3C in that a charge compensation layer is provided between the upper electrode and the ferroelectric layer. Specifically, the ferroelectric memory according to the invention includes the lower electrode 1, the ferroelectric layer 2 formed on the lower electrode 1, a charge compensation layer 7 formed on the ferroelectric layer 2, and a plurality of (two in the example shown in the drawings) upper electrodes 3a and 3b formed on the charge compensation layer 7. In the example shown in the drawings, the lower electrode 1 forming capacitors is a common electrode.

The lower electrode 1, the ferroelectric layer 2, the charge compensation layer 7, and the upper electrode 3a make up a first capacitor C1. The lower electrode 1, the ferroelectric layer 2, the charge compensation layer 7, and the upper electrode 3b make up a second capacitor C2.

A phenomenon in which a polarization reversal propagates is described below with reference to FIGS. 1A to 1C.

Figure 1A:
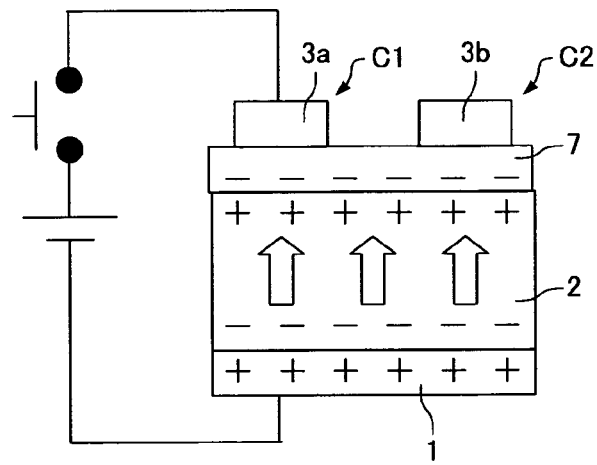
FIGS. 1A to 1C are conceptual diagrams showing an operation principle according to the invention.

As shown in FIG. 1A, when an upward spontaneous polarization occurs in the ferroelectric layer 2, negative charges are present at the lower part of the ferroelectric layer 2, and positive charges are present at the upper part of the ferroelectric layer 2. Positive surface charges are induced on the lower surface (lower electrode 1) of the ferroelectric layer 2, and negative surface charges are induced on the upper surface (charge compensation layer 7) of the ferroelectric layer 2.

Figure 1B:
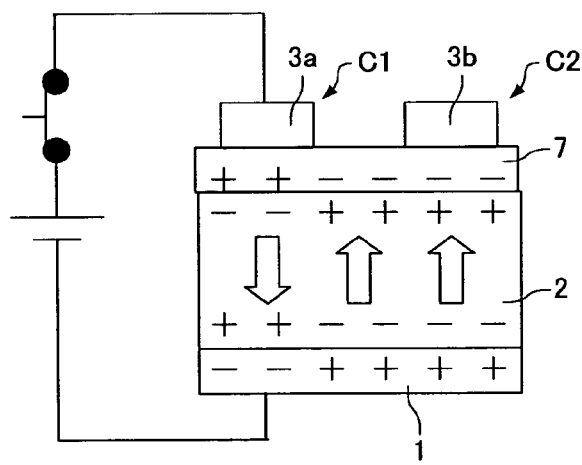

When applying a polarization reversal voltage to the first capacitor C1 on the left of the ferroelectric capacitors C1 and C2 polarized in a state shown in FIG. 1A, a polarization reversal occurs in the first capacitor C1, as shown in FIG. 1B. As shown in FIG. 1C, the polarization reversal propagates to the region in which the upper electrodes 3a and 3b are not formed on the ferroelectric layer 2. As shown in FIG. 1C, the polarization reversal propagates over the entire region of the ferroelectric layer 2, whereby a polarization reversal also occurs in the second capacitor C2 on the right. In the memory cell shown in FIGS. 1A to 1C, the domain wall does not occur due to the presence of the charge compensation layer 7 so that the polarization state of the domain formed in the first capacitor C1 propagates to the adjacent second capacitor C2. The memory device according to the invention completely differs from the ferroelectric memory shown in FIGS. 3A to 3C in terms of this point.

Specifically, the inventors of the invention has found that a polarization in a specific direction which has occurred in the first capacitor C1 can be propagated in the ferroelectric layer 2 by forming the charge compensation layer 7 on the ferroelectric layer 2 to complete the invention. The reason that the polarization propagates (domain wall moves) by providing the charge compensation layer 7 has not yet been clarified.

A method of controlling the propagation of the polarization reversal is described below with reference to FIGS. 2A to 2C.

Figure 1C:
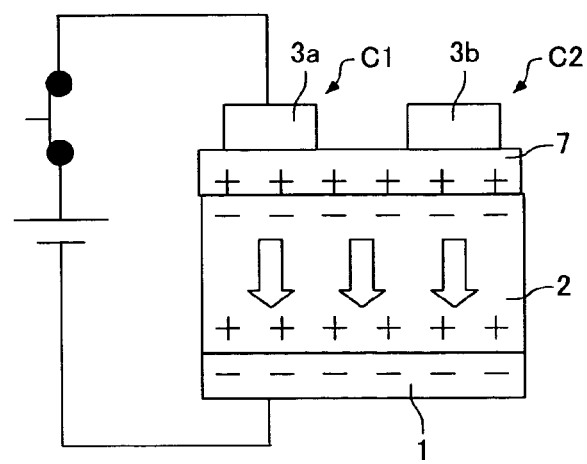
Figure 2A:
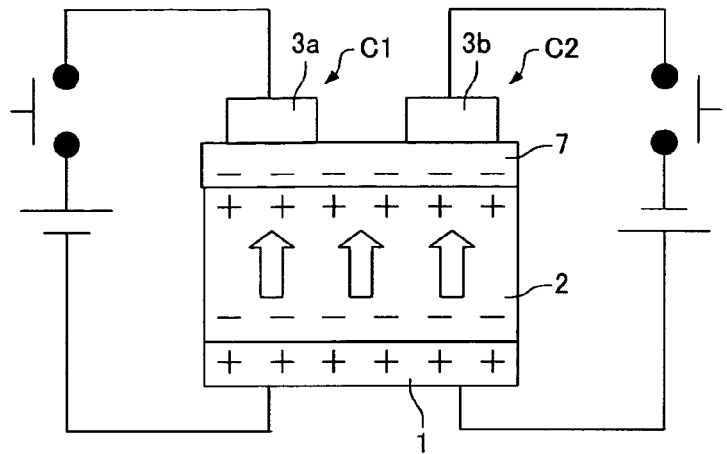
FIGS. 2A to 2C are conceptual diagrams showing an operation principle according to the invention.
Figure 2B:
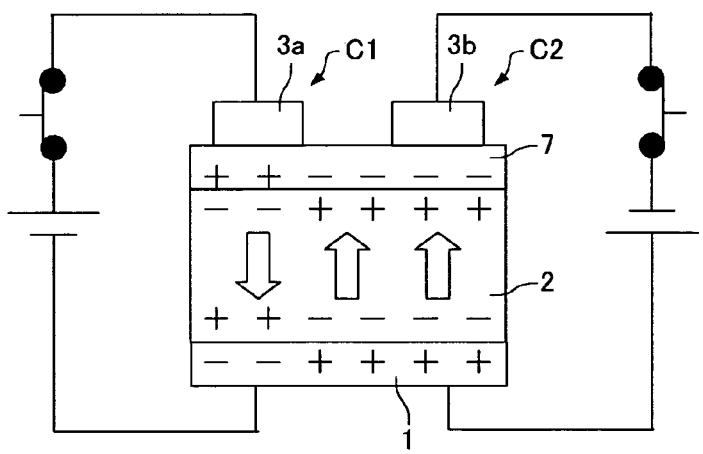
Figure 2C:
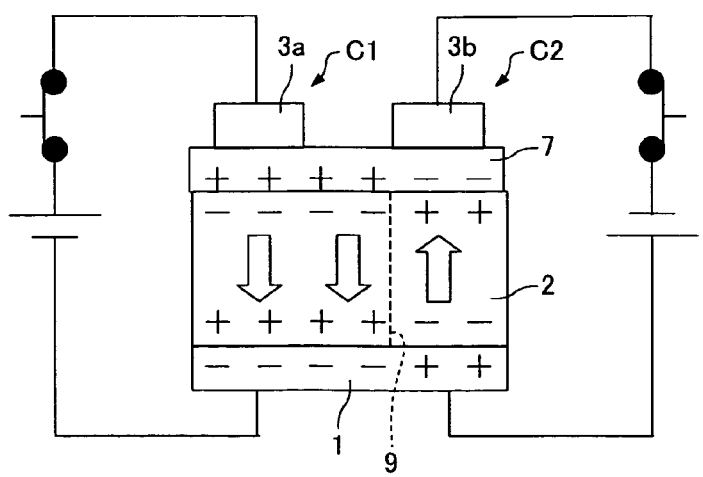

FIGS. 2A to 2C show a configuration similar to that of the memory cell shown in FIGS. 1A to 1C except that the voltages applied to the right and left capacitors C1 and C2 can be independently controlled.

As shown in FIG. 2A, when an upward spontaneous polarization occurs in the ferroelectric layer 2, negative charges are present at the lower part of the ferroelectric layer 2, and positive charges are present at the upper part of the ferroelectric layer 2. Positive surface charges are induced on the lower surface (lower electrode 1) of the ferroelectric layer 2, and negative surface charges are induced on the upper surface (charge compensation layer 7) of the ferroelectric layer 2.

In the first capacitor C1 on the left, a negative voltage is applied to the lower electrode 1, and a positive voltage is applied to the upper electrode 3a, as shown in FIG. 2B. In the second capacitor C2 on the right, a positive voltage is applied to the lower electrode 1, and a negative voltage is applied to the upper electrode 3b. In this state, a polarization reversal occurs in the capacitor C1 on the left, as shown in FIG. 2B. As shown in FIG. 2C, the polarization reversal propagates in the region in which the upper electrodes 3a and 3b are not formed on the ferroelectric layer 2 in the same manner as in FIG. 1C. As shown in FIG. 2C, since the voltage opposite to that of the first capacitor C1 on the left is applied to the second capacitor C2 on the right, the polarization reversal does not propagate to the second capacitor C2. Specifically, the domain wall 9 is formed at the boundary with the capacitor C2 in the memory cell shown in FIGS. 2A to 2C.

In the memory cell shown in FIGS. 2A to 2C, when causing a polarization reversal to occur in the first capacitor C1, the polarization reversal propagates in the ferroelectric layer 2. However, the polarization reversal stops at the boundary with the second capacitor C2 to which the voltage opposite in polarity to that of the first capacitor C1 is applied. Specifically, the propagation of the polarization can be controlled in the memory device according to the invention by utilizing an electric field applied to the capacitor.

Figure 4:
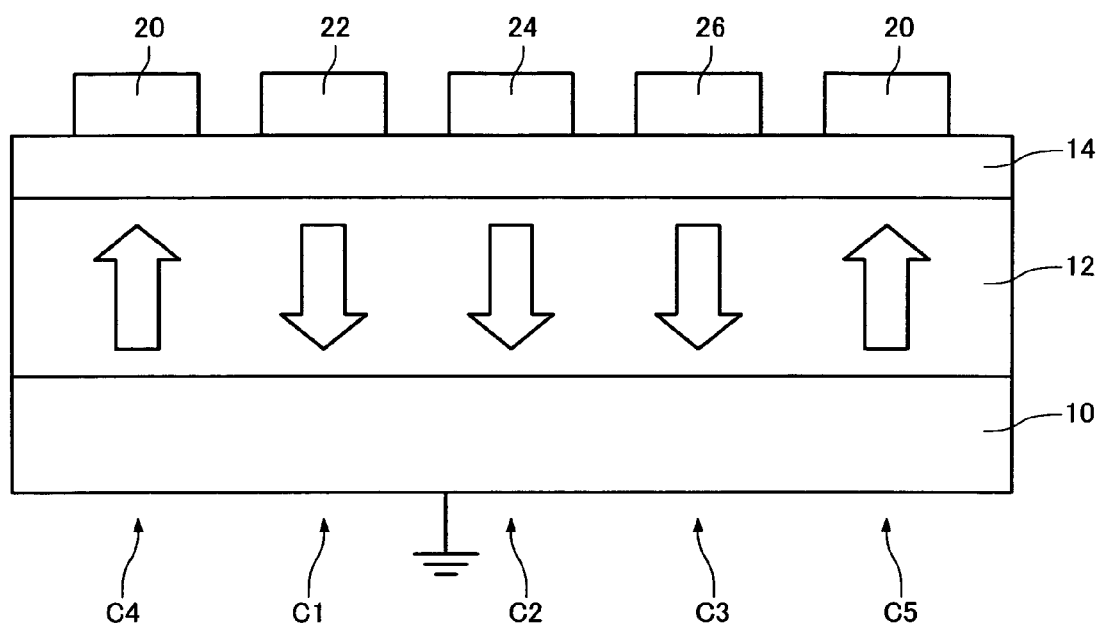
FIG. 4 is a cross-sectional view schematically showing a first memory device according to one embodiment of the invention.
Figure 5:
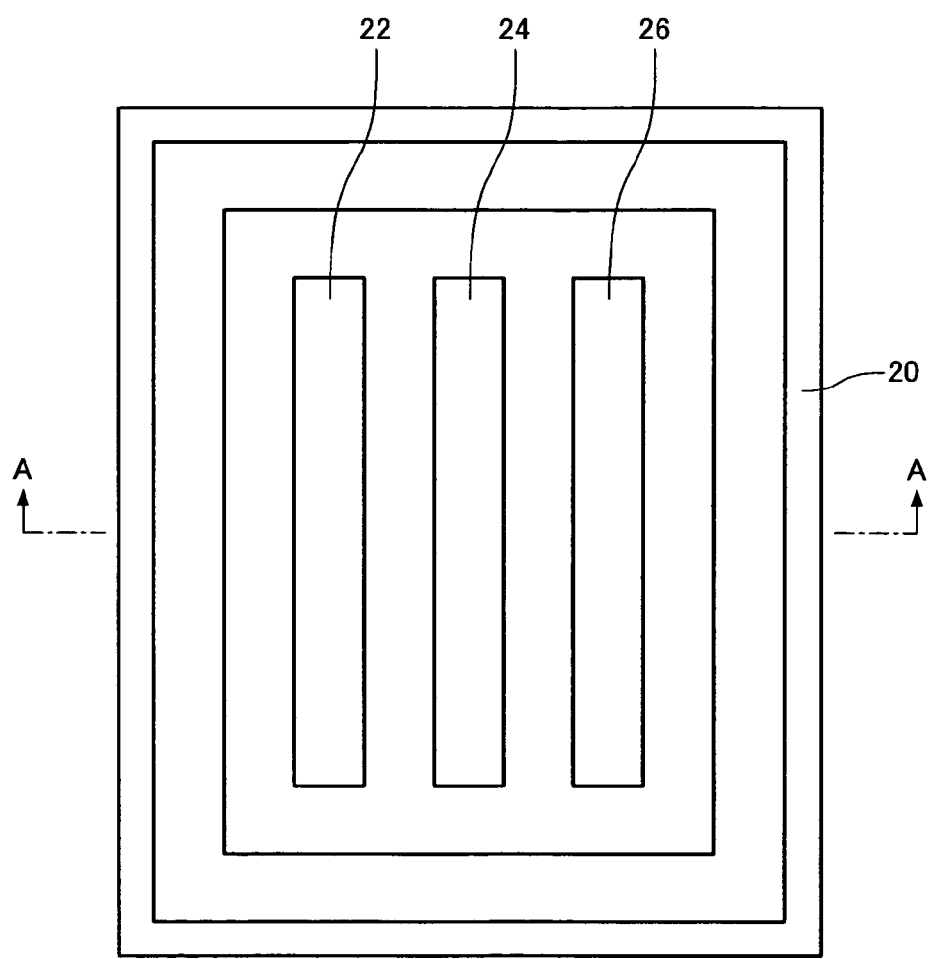
FIG. 5 is a plan view schematically showing the first memory device according to one embodiment of the invention.

FIGS. 4 and 5 show a first example of a memory device according to an embodiment to which the invention is applied. FIG. 4 is a cross-sectional view schematically showing the memory device, and FIG. 5 is a plan view of the memory device. FIG. 4 is a cross-sectional view along the line A-A shown in FIG. 5.

The memory device according to this embodiment includes a lower electrode 10 formed on a substrate (not shown), a ferroelectric layer 12 formed on the lower electrode 10, a charge compensation layer 14 formed on the ferroelectric layer 12, and upper electrodes formed on the charge compensation layer 14.

In the example shown in FIGS. 4 and 5, the memory device includes a saturated polarization forming electrode 22, a writing electrode 24, a reading electrode 26, and a terminating electrode 20 as the upper electrodes. In this embodiment, the lower electrode 10 is a common electrode for each capacitor. As shown in FIG. 5, the saturated polarization forming electrode 22, the writing electrode 24, and the reading electrode 26 are formed apart in a stripe shape. As shown in FIG. 5, the terminating electrode 20 is formed to enclose the saturated polarization forming electrode 22, the writing electrode 24, and the reading electrode 26.

In the example shown in FIGS. 4 and 5, the memory device includes five capacitors C1 to C5 in the cross-sectional view shown in FIG. 4. Specifically, the memory device in this example includes a first capacitor C1 including the saturated polarization forming electrode 22, a second capacitor C2 including the writing electrode 24, a third capacitor C3 including the reading electrode 26, and fourth capacitors C4 and C5 including the terminating electrode 20.

The saturated polarization forming electrode 22 is an electrode for causing a saturated remanent polarization to occur in the first capacitor C1 to form a domain polarized in a specific direction. It suffices that the saturated polarization occur in the first capacitor C1, and its hysteresis loop may not be open. Therefore, an electric field necessary for causing the polarization in the first capacitor C1 to be completely saturated is applied to the saturated polarization forming electrode 22. Such an electric field may be applied using a pulse signal.

The saturated polarization formed in the first capacitor C1 (corresponding to the first capacitor C1 in FIGS. 1A and 2A) including the saturated polarization forming electrode 22 propagates in the ferroelectric layer 12 and reverses the polarization in the second capacitor C2 including the writing electrode 24 and the third capacitor C3 including the reading electrode 26, as described above. The propagation of the polarization reversal is suppressed by the capacitors C4 and C5 including the terminating electrode 20. The capacitors C4 and C5 including the terminating electrode 20 are capacitors for suppressing the propagation of the saturated polarization in the ferroelectric layer 12. Specifically, the capacitors C4 and C5 including the terminating electrode 20 have the same function as the capacitor C2 shown in FIG. 2C.

The writing electrode 24 is an electrode for writing a signal "0" or "1" by applying a small electric field which does not reverse the polarization in the second capacitor C2. Specifically, when applying an electric field which does not cause a polarization reversal to the writing electrode 24 using a pulse signal, the amount of polarization in the third capacitor C3 including the reading electrode 26 changes. Information can be read by detecting the amount of the change as the amount of polarization or the amount of induced current. This operation is described later in detail in the experimental examples.

The charge compensation layer 14, which is the most important feature of the invention, has a function of causing the saturated polarization in the first capacitor C1 including the saturated polarization forming electrode 22 to propagate in the ferroelectric layer 12, although the reason is not clarified. In this embodiment, the saturated polarization formed in the capacitor C1 including the saturated polarization forming electrode 22 can be propagated to a domain in a desired region of the ferroelectric layer 12 by providing the charge compensation layer 14, whereby the polarization information can be written into the domain.

The charge compensation layer 14 is formed of an oxide having a composition differing from that of the ferroelectric layer 12. As examples of the material for the charge compensation layer 14, a paraelectric, an oxide semiconductor, a ferroelectric, and the like can be given.

The memory device according to this embodiment has the following features.

A saturated remanent polarization is caused to occur in the first capacitor C1 by applying a predetermined electric field to the saturated polarization forming electrode 22. The saturated polarization can propagate in the ferroelectric layer 12, and information can be read by converting the saturated polarization into an induced current in another region such as the capacitor C3 including the reading electrode 26. Information can be written by changing the saturated polarization state by applying a small electric field which does not cause a polarization reversal to the capacitor C2 through the writing electrode 24.

Since this memory device utilizes the saturated polarization instead of the threshold value (remanent polarization Pr) of the coercive force hysteresis of the ferroelectric utilized in a known ferroelectric memory, hysteresis characteristics such as hysteresis squareness are not required, that is, the ferroelectric layer may exhibit poor hysteresis squareness. This means that the thickness of the ferroelectric layer can be reduced. Since the domain wall can move at an extremely high speed such as one picosecond (psec), a high-speed operation is expected. Moreover, since the ferroelectric layer 12 is in the shape of a film and does not require microprocessing in cell units, differing from a known FeRAM, deterioration in the characteristics of the ferroelectric can be prevented.

Figure 6:
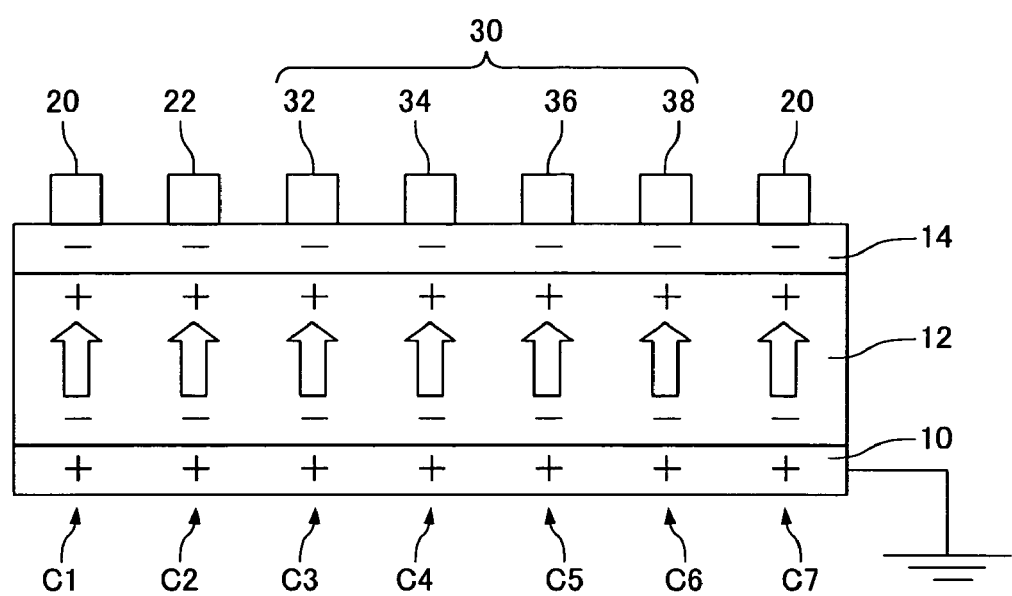
FIG. 6 is a cross-sectional view schematically showing a second memory device according to one embodiment of the invention.
Figure 7:
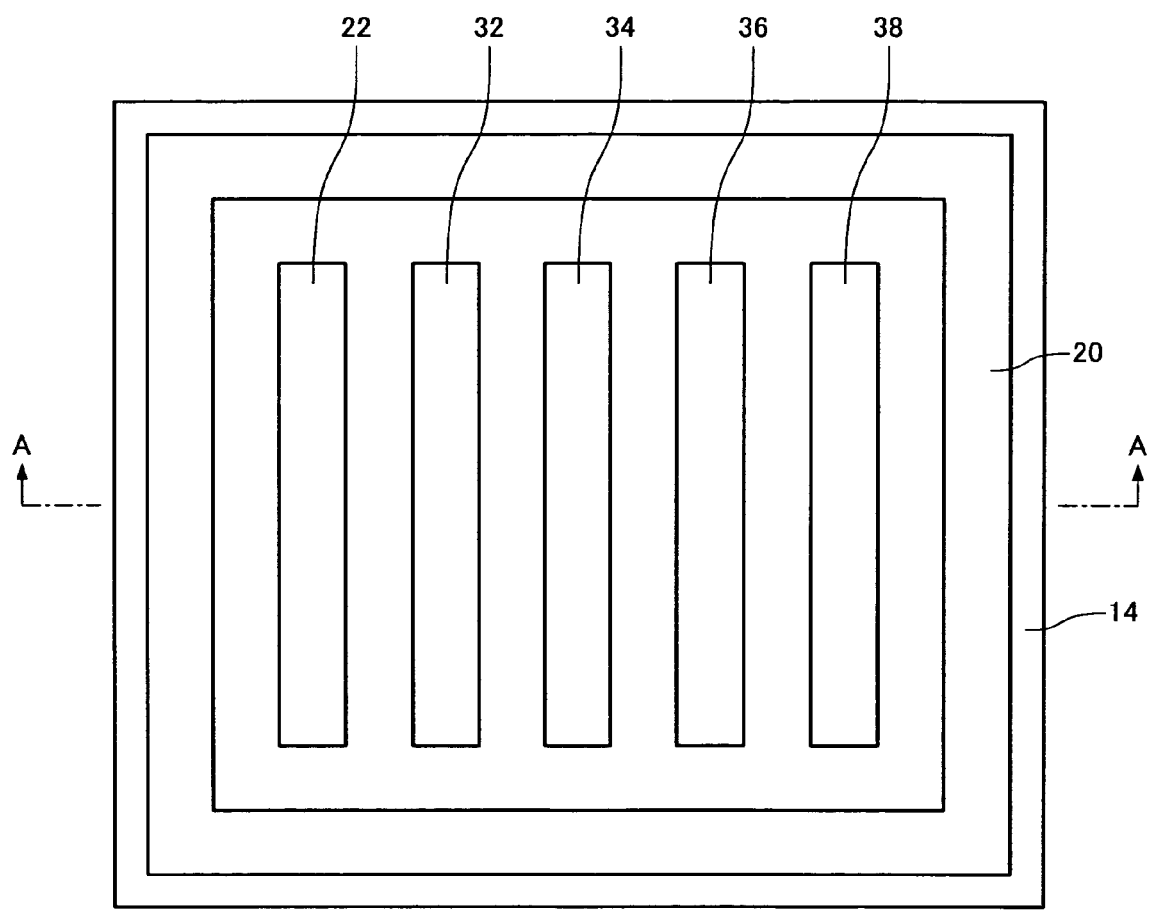
FIG. 7 is a plan view schematically showing the second memory device according to one embodiment of the invention.

A second example of a memory device according to this embodiment shown in FIGS. 6 and 7 is described below.

The memory device according to this embodiment includes the lower electrode 10 formed on a substrate (not shown), the ferroelectric layer 12 formed on the lower electrode 10, the charge compensation layer 14 formed on the ferroelectric layer 12, and the upper electrodes formed on the charge compensation layer 14. In the example shown in the drawings, the memory device may include the saturation polarization forming electrode 22, a writing/reading electrode 30 (four writing/reading electrodes 32, 34, 36, and 38 in the example shown in FIGS. 6 and 7), and the terminating electrode 20 as the upper electrodes. In this embodiment, the lower electrode 10 is a common electrode for each capacitor.

In the example shown in FIGS. 6 and 7, the memory device includes seven capacitors C1 to C7 in the cross-sectional view shown in FIG. 6. As shown in FIG. 7, the saturated polarization forming electrode 22 and the writing/reading electrodes 32, 34, 36, and 38 are formed in a stripe shape. As shown in FIG. 7, the terminating electrode 20 is formed to enclose the saturated polarization forming electrode 22 and the writing/reading electrodes 32, 34, 36, and 38.

The saturation polarization forming electrode 22 is an electrode for causing a saturated remanent polarization to occur in the capacitor C2 to form a domain polarized in a specific direction, as described in the first example.

The writing/reading electrodes 32, 34, 36, and 38 are electrodes for writing and reading information, as described in the first example. Specifically, a signal "0" or "1" can be written by applying a small electric field which does not reverse the polarization in the capacitors C3 to C6 to the writing/reading electrodes 32, 34, 36, and 38. Information can be read by detecting the amount of polarization in the capacitors C3 to C6 as the amount of induced current.

The terminating electrode 20 is an electrode for suppressing the propagation of the polarization reversal, as described in the first example.

The charge compensation layer 14 has a function of causing the saturated polarization in the first capacitor C1 including the saturated polarization forming electrode 22 to propagate in the ferroelectric layer 12, as described in the first example.

A method of controlling the memory device according to the second example of this embodiment is described below.

A writing method is described below with reference to FIGS. 8A to 8F. In FIGS. 8A to 8F, the symbol "+" or "−" indicates the polarity of the applied voltage. The lower electrode 10 is grounded.

Figure 8A:
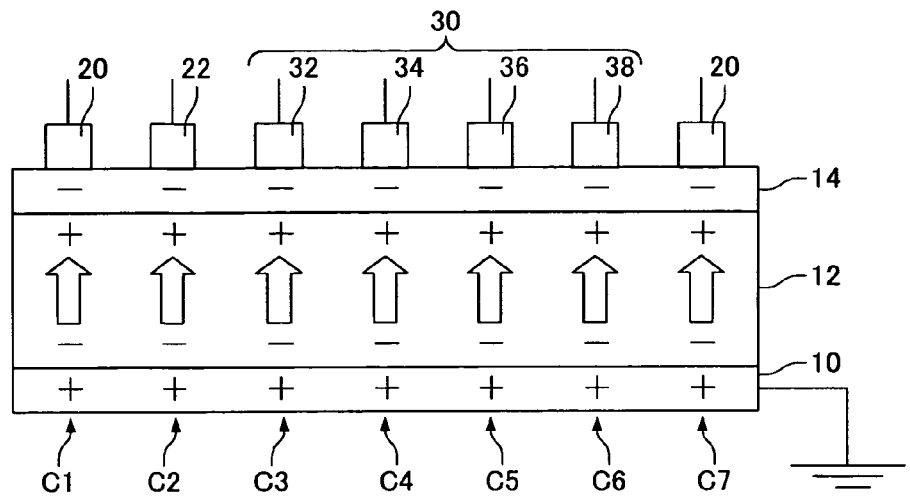
FIGS. 8A to 8F are cross-sectional views showing operations of the second memory device according to one embodiment of the invention.

As shown in FIG. 8A, when a voltage is not applied to each electrode, a polarization in a predetermined direction (upward in the example shown in FIG. 8A) occurs in the ferroelectric layer 12 due to the spontaneous polarization of the ferroelectric.

Figure 8B:
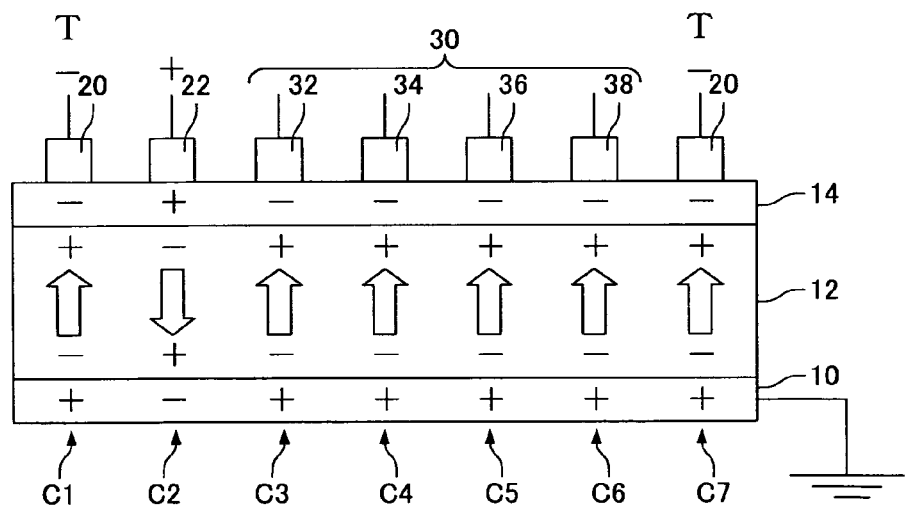

As shown in FIG. 8B, a voltage which causes a polarization reversal is applied to the saturated polarization forming electrode 22. A terminating voltage which prevents the propagation of the polarization reversal due to the voltage applied to the saturated polarization forming electrode 22 is applied to the terminating electrode 20. In example shown in FIG. 8B, a positive voltage is applied to the saturated polarization forming electrode 22, and a negative voltage is applied to the terminating electrode 20.

Figure 8C:
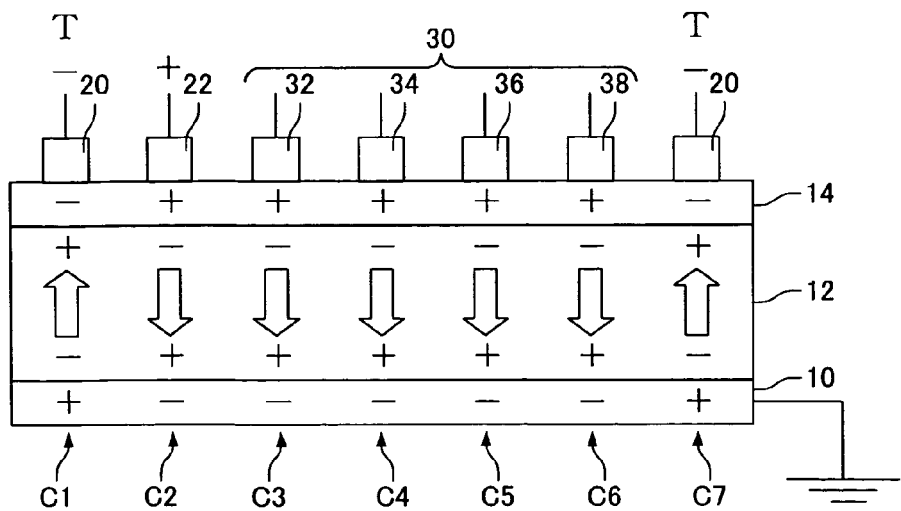

As shown in FIG. 8C, the polarization reversal which has occurred in the capacitor C2 due to the application of the voltage to the saturated polarization forming electrode 22 propagates to the capacitors C3 to C6 including the writing/reading electrodes 30 (four writing/reading electrodes 32, 34, 36, and 38 in the example shown in FIG. 8C), whereby a polarization reversal sequentially occurs in the capacitors C3 to C6. The propagation of the polarization reversal occurs in the same manner as described above (see FIGS. 1A to 1C). When the polarization reversal has propagated to the capacitor C6 including the rightmost writing/reading electrode 38, the polarization reversal stops at the capacitor C7 including the terminating electrode 20. The propagation of the polarization reversal stops in the same manner as described above (see FIGS. 2A to 2C).

Figure 8D:
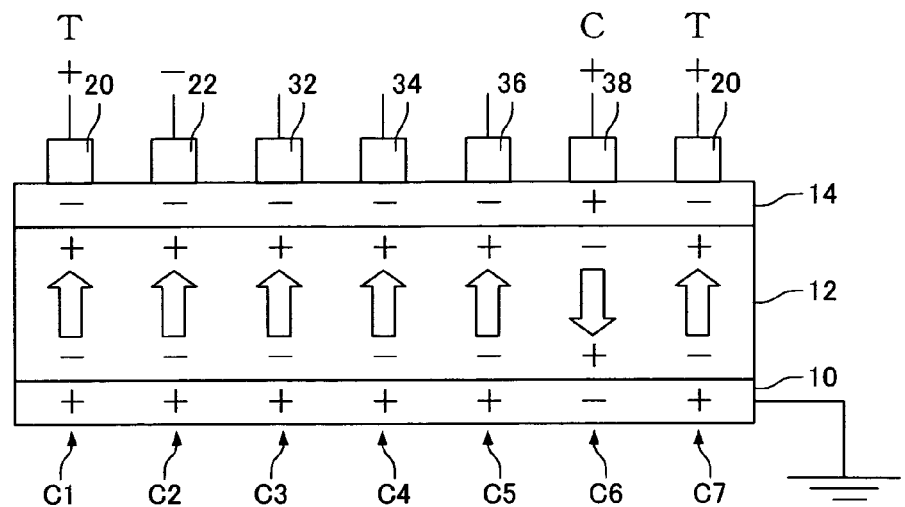

As shown in FIG. 8D, a positive control voltage C is applied to the writing/reading electrode 38 adjacent to the terminating electrode 20. At the same time, a negative voltage is applied to the saturated polarization forming electrode 22, and a positive terminating voltage T is applied to the terminating electrode 20. The polarization in the capacitors C2 to C5 except the capacitor C6 including the writing/reading electrode 38 is reversed due to the control voltage C, whereby information is recorded (written) in the capacitor C6. In the example shown in FIG. 8D, an upward polarization occurs in the capacitors C2 to C5.

Figure 8E:
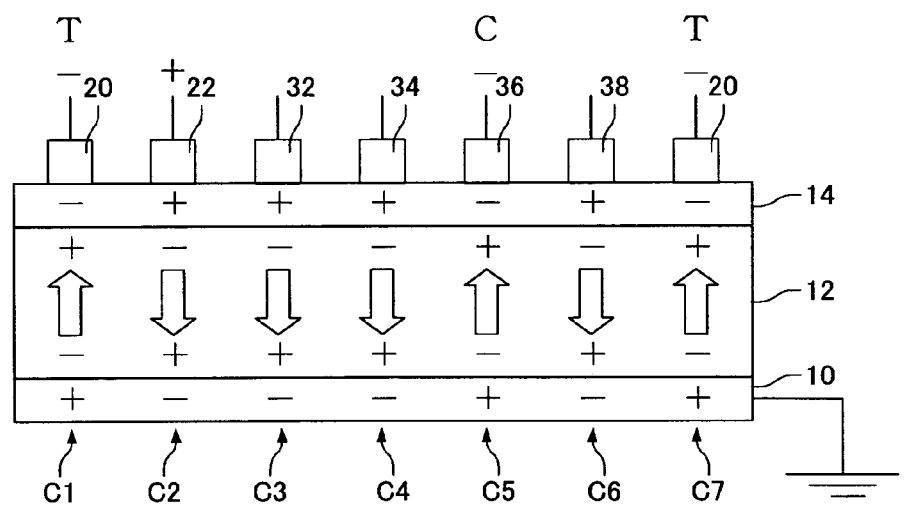

As shown in FIG. 8E, a positive voltage is applied to the saturated polarization forming electrode 22, and a negative terminating voltage T is applied to the terminating electrode 20. At the same time, a negative control voltage C is applied to the writing/reading electrode 36 of the capacitor C5 which is the third capacitor from the right. This causes a polarization reversal to occur in the capacitor C2 including the saturated polarization forming electrode 22 and in the capacitors C3 and C4 including the writing/reading electrodes 32 and 34 adjacent to the saturated polarization forming electrode 22. Moreover, information can be recorded in the capacitor C5 which is the third capacitor from the right.

Figure 8F:
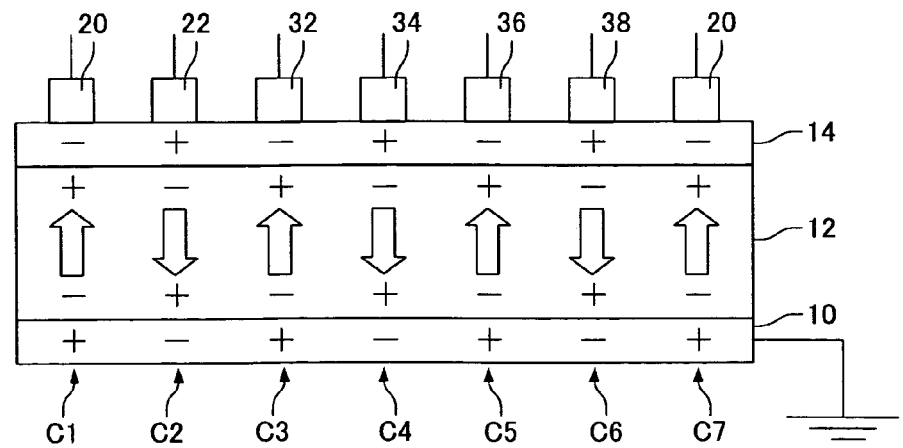

As shown in FIG. 8F, data can be recorded in each of the capacitors C2 to C6 excluding the capacitors C1 and C7 including the terminating electrode 20 by repeatedly performing the above operation.

The above operation allows data to be written into the capacitors C3 to C6 including the writing/reading electrodes 30 (32, 34, 36, and 38). The data is read from the capacitors C3 to C6 through the writing/reading electrodes 30.

The memory device according to the invention may be obtained using the following manufacturing method (see FIG. 6), for example.

The lower electrode 10 is formed on a substrate (not shown). The substrate is not particularly limited. An insulating substrate or the like may be used. The lower electrode 10 is not particularly limited. A metal such as a platinum metal, a conductive oxide, or the like may be used. The lower electrode 10 forms one of the electrodes of the capacitor. The lower electrode 10 may be a common electrode, and may be patterned.

The ferroelectric layer 12 is formed on the lower electrode 10. The material for the ferroelectric layer 12 is not particularly limited. The method of forming the ferroelectric layer 12 is not particularly limited. A liquid phase method such as a sol-gel method, a vapor phase method such as CVD, sputtering, or laser ablation, or the like may be used.

The charge compensation layer 14 is formed on the ferroelectric layer 12. As the material for the charge compensation layer 14, the above-mentioned material may be used. The method of forming the charge compensation layer 14 is not particularly limited. A liquid phase method such as a sol-gel method, a vapor phase method such as CVD, sputtering, or laser ablation, or the like may be used.

The upper electrode with a predetermined pattern is formed on the charge compensation layer 14. The saturated polarization forming electrode 22, the writing/reading electrodes 30 (writing/reading electrodes 32, 34, 36, and 38 in FIG. 6), and the terminating electrode 20 are formed as the upper electrodes. The upper electrode is not particularly limited. A metal such as a platinum metal or aluminum, a conductive oxide, or the like may be used. The method of forming the upper electrode is not particularly limited. A liquid phase method such as a sol-gel method, a vapor phase method such as CVD, sputtering, or laser ablation, or the like may be used. The upper electrode may be patterned using a known lithography and etching technology or the like.

The memory device according to this embodiment may be manufactured in this manner.

2. EXPERIMENTAL EXAMPLES

2.1. First Experimental Example

Figure 9:
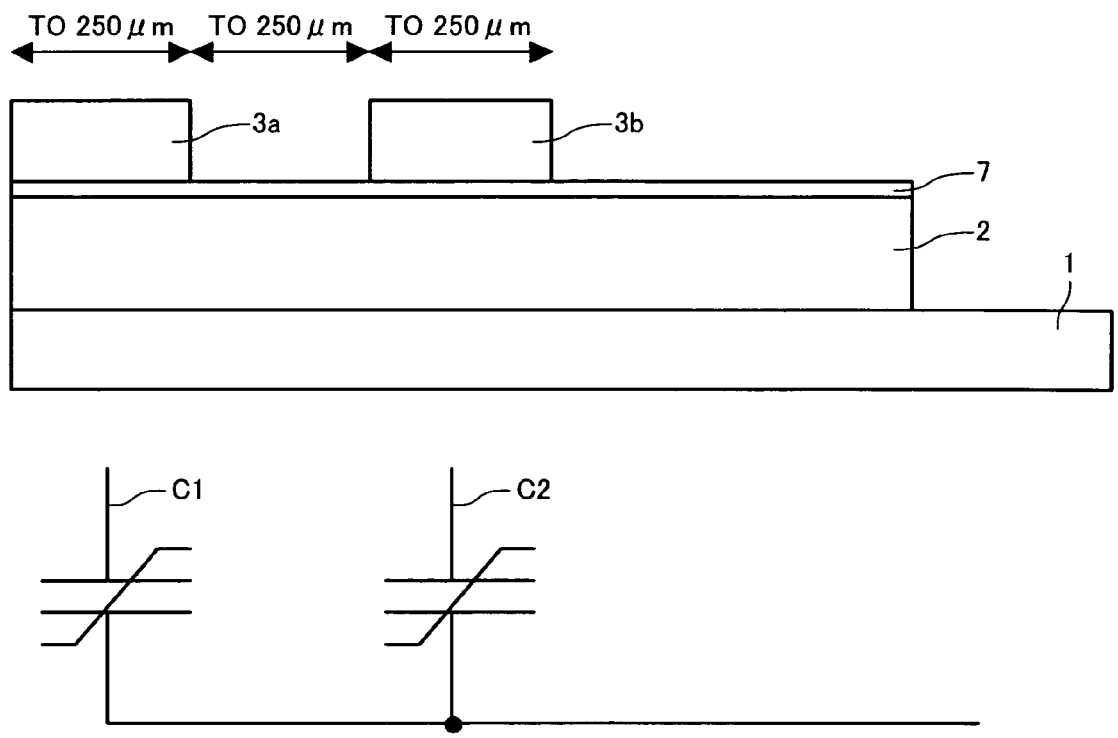
FIG. 9 is a cross-sectional view schematically showing a sample used in a first experimental example according to the invention.
Figure 10A:
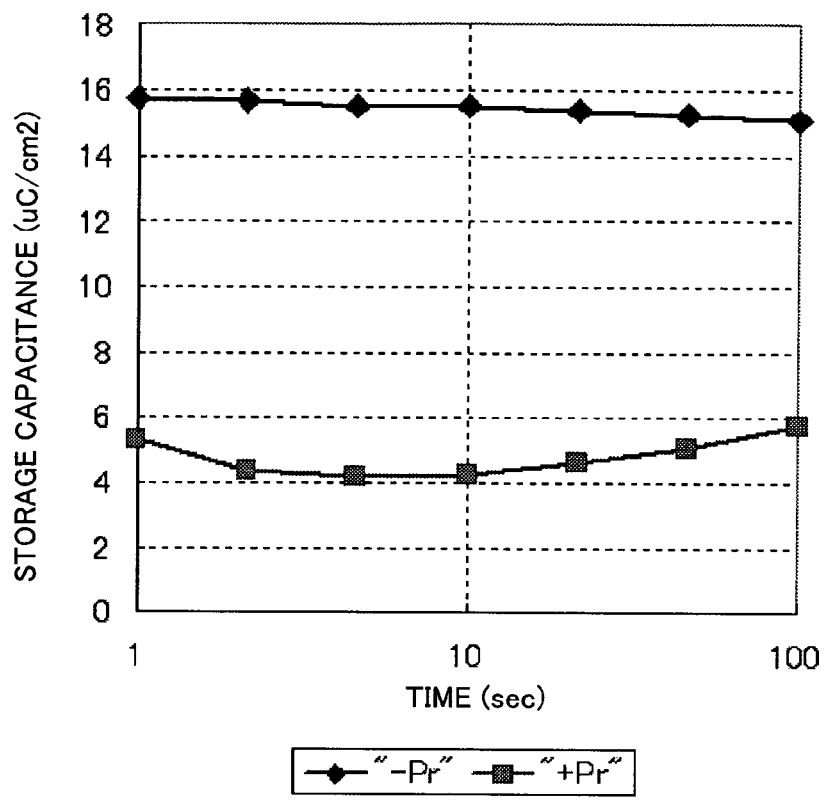
FIG. 10A is a graph showing experimental results obtained by using Sample 1 of the first experimental example according to the invention.
Figure 10B:
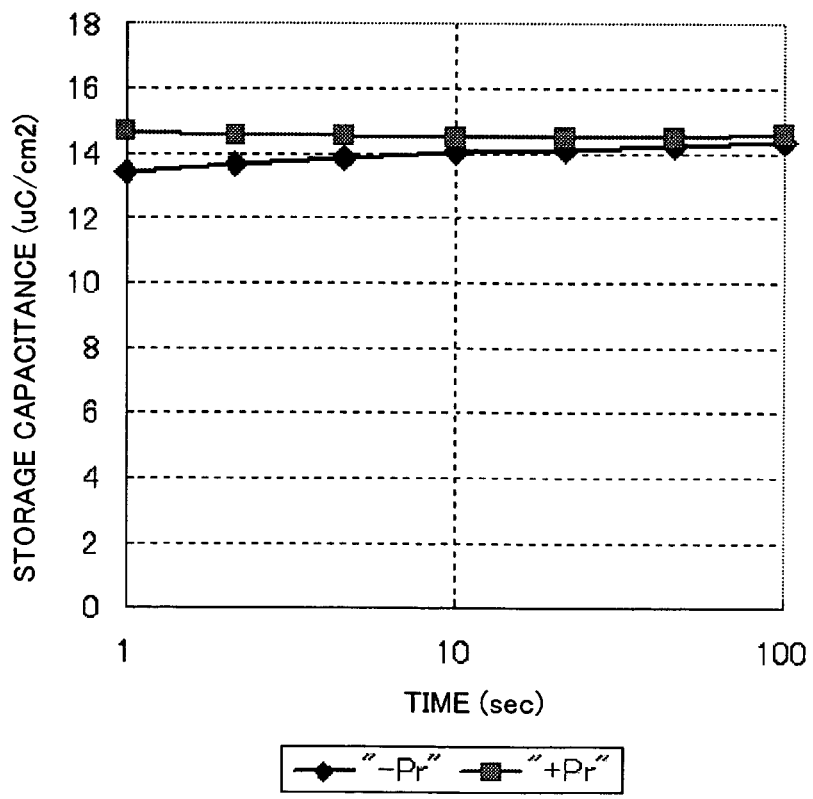
FIG. 10B is a graph showing experimental results obtained by using Comparative Sample 2.

FIGS. 9, 10A, and 10B show the results of an example of an experiment on the memory device according to the invention.

The objective of the experiment is to demonstrate that a polarization reversal in a first capacitor propagates to the adjacent second capacitor.

As shown in FIG. 9, a sample used for this experiment includes the lower electrode 1 formed of platinum, the ferroelectric layer 2 formed of PZTN (Pb(Zr,Ti,Nb)O$_3$) on the lower electrode 1, the charge compensation layer 7 formed of nickel oxide, and two upper electrodes 3a and 3b formed of platinum on the charge compensation layer 7. This sample is referred to as Sample 1. In Sample 1, a capacitor C1 including the upper electrode (saturated polarization forming electrode) 3a and a capacitor C2 including the upper electrode (reading electrode) 3b are connected in parallel. The upper electrode 3a and 3b are both 250 micrometers in width, and the interval between the upper electrodes 3a and 3b is 250 micrometers.

Comparative Sample 2 was formed which had the same configuration as Sample 1 except that the charge compensation layer 7 was not provided.

The storage capacitance during reading was measured for Samples 1 and 2. The results are shown in FIGS. 10A and 10B. In FIGS. 10A and 10B, the horizontal axis indicates time, and the vertical axis indicates the storage capacitance of the capacitor. In the measurement of the storage capacitance, a voltage (+6 V (+Pr) or −6 V (−Pr) in this example) sufficient to cause a saturated polarization to occur was applied to the first capacitor C1 including the upper electrode 3a. Data was read from and rewritten into the second capacitor C2 including the upper electrode 3b.

In Sample 1 according to the invention, when the voltage applied to the first capacitor C1 was +Pr and −Pr, storage capacitances of different polarities corresponding to the voltage applied to the first capacitor were obtained in the second capacitor, as shown in FIG. 10A. In Comparative Sample 2, when the voltage applied to the first capacitor C1 was +Pr and −Pr, almost the same storage capacitances were obtained in the second capacitor irrespective of the voltage applied to the first capacitor, as shown in FIG. 10B. The following item was confirmed from these results.

It was confirmed that the saturated polarization state formed in the first capacitor propagates to the adjacent second capacitor in Sample 1 according to the invention, whereby a storage capacitance of the same polarity as that of the first capacitor can be stably obtained. On the other hand, a polarization state propagation phenomenon such as that of Sample 1 was not confirmed in Comparative Sample 2 which does not include the charge compensation layer.

2.2. Second Experimental Example

Figure 11:
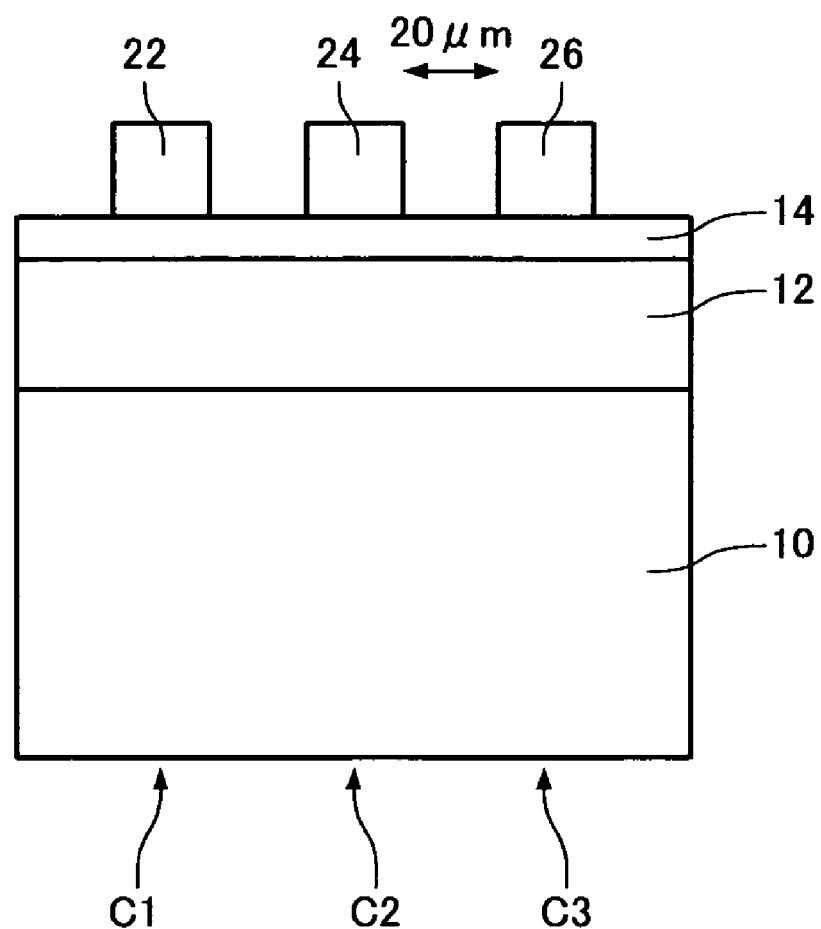
FIG. 11 is a cross-sectional view schematically showing a sample used in a second experimental example according to the invention.

FIG. 11 is a view showing a sample used in this experiment example. The sample used for this experiment includes the lower electrode 10 formed of platinum, the ferroelectric layer 2 formed of PZTN (Pb(Zr,Ti,Nb)O$_3$) on the lower electrode 10, the charge compensation layer 14 formed of nickel oxide, and the upper electrodes (saturated polarization forming electrode 22, writing electrode 24, and reading electrode 26) formed of platinum on the charge compensation layer 14. The thickness of the ferroelectric layer 2 was 150 nanometers, and the thickness of the charge compensation layer 14 was 20 nanometers. The upper electrodes 22, 24, and 26 were in the shape of a 100-micrometer square, and the interval between the upper electrodes was 20 micrometers.

The capacitor including the saturated polarization forming electrode 22 is referred to as a first capacitor C1. The capacitor including the writing electrode 24 is referred to as a second capacitor C2. The capacitor including the reading electrode 26 is referred to as a third capacitor C3.

A pulse (single pulse) at 100 kHz and +6 V was applied to the saturated polarization forming electrode 22 of the capacitor C1. The hysteresis polarization (initial value) in the capacitor C1 was +Pr=24.5 microcoulomb/cm$^2$ and −Pr=−27.6 microcoulomb/cm$^2$.

A pulse (single pulse) at 100 kHz and +6 V was applied to the saturated polarization forming electrode 22, and a pulse (single pulse) at 100 kHz and +0.5 V was then applied to the writing electrode 24. The polarization in the third capacitor including the reading electrode 26 was then determined and found to be +Pr=21.3 microcoulomb/cm$^2$ and −Pr=−22.7 microcoulomb/cm$^2$.

A pulse (single pulse) at 100 kHz and +6 V was applied to the saturated polarization forming electrode 22, and a pulse (single pulse) at 100 kHz and −0.5 V was then applied to the writing electrode 24. The polarization in the third capacitor including the reading electrode 26 was then determined and found to be +Pr=9.8 microcoulomb/cm$^2$ and −Pr=−35.7 microcoulomb/cm$^2$.

From these results, it was confirmed that the polarization in the third capacitor C3 including the reading electrode 26 is shifted to a large extent by causing a saturated polarization to occur in the first capacitor C1 and then applying a low voltage (+ or −) which does not cause a polarization reversal to the capacitor C2 through the writing electrode 24. For example, when focusing on the positive polarization, the polarization obtained through the reading electrode 26 when applying +0.5 V to the writing electrode 24 is +Pr=21.3 microcoulomb/cm$^2$, and the polarization obtained through the reading electrode 26 when applying −0.5 V to the writing electrode 24 is +Pr=9.8 microcoulomb/cm$^2$. Specifically, these values differ to a large extent. In was confirmed from such a shift in polarization that information "0" and "1" can be written with respect to a predetermined threshold value.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A memory device including a plurality of capacitors comprising:
   a lower electrode;
   a ferroelectric layer formed above the lower electrode;
   a charge compensation layer formed above the ferroelectric layer and including an oxide having a composition differing from a composition of the ferroelectric layer; and
   upper electrodes formed above the charge compensation layer, the upper electrodes including:
   a saturated polarization forming electrode used for forming a domain polarized to saturation in a predetermined direction in a predetermined region of the ferroelectric layer;
   a plurality of reading/writing electrodes for reading and writing information disposed apart from the saturated polarization forming electrode,
   at least the respective ferroelectric layer and the charge compensation layer constituting successive layers,
   the lower electrode, the ferroelectric layer, the charge compensation layer and the saturated polarization forming electrode constituting a first capacitor,
   the lower electrode, the ferroelectric layer, the charge compensation layer and the reading/writing layer constituting a second capacitor,
   the charge compensation layer being adapted to cause the saturated polarization formed by the saturated polarization forming electrode in the ferroelectric layer.

2. The memory device including a plurality of capacitors as defined in claim 1, further comprising:
   a terminating electrode disposed above the charge compensation layer to enclose the saturated polarization forming electrode and the reading/writing electrodes at an interval from the saturated polarization forming electrode, the writing electrode, and the reading electrode.

3. The memory device including a plurality of capacitors as defined in claim 1,
   wherein the saturated polarization forming electrode and the reading/writing electrodes are arranged in a stripe shape.

4. The memory device including a plurality of capacitors as defined in claim 1,
   wherein the charge compensation layer constitutes one of a paraelectric, an oxide semiconductor and a ferroelectric.

* * * * *